(12) United States Patent
Wang et al.

(10) Patent No.: US 12,295,248 B2
(45) Date of Patent: May 6, 2025

(54) DISPLAY ASSEMBLY, MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zuojia Wang, Beijing (CN); Liqiang Chen, Beijing (CN); Shuquan Yang, Beijing (CN); Jiafan Shi, Beijing (CN); Qiang He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 514 days.

(21) Appl. No.: 17/765,778

(22) PCT Filed: Apr. 12, 2021

(86) PCT No.: PCT/CN2021/086443
§ 371 (c)(1),
(2) Date: Mar. 31, 2022

(87) PCT Pub. No.: WO2021/233001
PCT Pub. Date: Nov. 25, 2021

(65) Prior Publication Data
US 2022/0384746 A1  Dec. 1, 2022

(30) Foreign Application Priority Data

May 18, 2020 (CN) .......................... 202010420932.7

(51) Int. Cl.
*H10K 77/10* (2023.01)
*H10K 50/80* (2023.01)
(Continued)

(52) U.S. Cl.
CPC .......... *H10K 77/111* (2023.02); *H10K 50/80* (2023.02); *H10K 50/86* (2023.02); *H10K 50/87* (2023.02);
(Continued)

(58) Field of Classification Search
CPC .... H10K 50/80; H10K 59/40; H10K 59/8791; H10K 59/8794; H10K 71/00;
(Continued)

(56) References Cited

U.S. PATENT DOCUMENTS

2017/0293194 A1  10/2017  Hou et al.
2018/0206330 A1   7/2018  Cao et al.
2020/0310577 A1* 10/2020  Jeon ..................... H10K 59/873

FOREIGN PATENT DOCUMENTS

CN  105960157 A   9/2016
CN  109073926 A  12/2018
(Continued)

OTHER PUBLICATIONS

Zhao Yong, Plasma Display (PDP) Technology, 7.5 Electromagnetic shielding film, Feb. 18, 2013, pp. 96-98, Defense Industry Press.
(Continued)

*Primary Examiner* — Amar Movva
*Assistant Examiner* — Sandra Milena Rodriguez Villan
(74) *Attorney, Agent, or Firm* — XSENSUS LLP (57) ABSTRACT

A display assembly includes a cover plate, a film assembly, a flexible display panel and a circuit board. The flexible display panel includes a panel body and a bending portion connected to a side of the panel body. The cover plate, the film assembly and the panel body are sequentially stacked.
(Continued)

The circuit board is disposed on a side of the panel body away from the film assembly, and the bending portion is electrically connected to the circuit board. The display assembly further includes a first bonding portion, the first bonding portion is disposed at a first side edge of the film assembly to bond at least one of the cover plate and the film assembly to the bending portion, and the first side edge of the film assembly is an edge of the film assembly proximate to the bending portion.

17 Claims, 7 Drawing Sheets

(51) Int. Cl.
    *H10K 50/86*     (2023.01)
    *H10K 50/87*     (2023.01)
    *H10K 59/40*     (2023.01)
    *H10K 71/00*     (2023.01)
    *H10K 59/80*     (2023.01)
    *H10K 102/00*     (2023.01)

(52) U.S. Cl.
    CPC .............. *H10K 59/40* (2023.02); *H10K 71/00* (2023.02); *H10K 59/8791* (2023.02); *H10K 59/8794* (2023.02); *H10K 2102/311* (2023.02)

(58) Field of Classification Search
    CPC ................... G09F 9/301; G06F 3/0412; G06F 2203/04102; G06F 2203/04103; G06F 2203/04107
    See application file for complete search history.

(56) References Cited

FOREIGN PATENT DOCUMENTS

| | | |
|---|---|---|
| CN | 109859632 A | 6/2019 |
| CN | 110491883 A | 11/2019 |
| CN | 110597420 A | 12/2019 |
| CN | 110865732 A | 3/2020 |
| CN | 210244319 U | 4/2020 |
| CN | 111128020 A | 5/2020 |
| CN | 111599272 A | 8/2020 |
| KR | 10-2014-0055607 A | 5/2014 |
| KR | 10-2014-0141142 A | 12/2014 |

OTHER PUBLICATIONS

The First Office Action for the Chinese Patent Application No. 202010420932.7 issued by the Chinese Patent Office on Sep. 8, 2021.

The Second Office Action for the Chinese Patent Application No. 202010420932.7 issued by the Chinese Patent Office on Mar. 18, 2022.

* cited by examiner

DISPLAY ASSEMBLY, MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN2021/086443, filed on Apr. 12, 2021, which claims priority to Chinese Patent Application No. 202010420932.7, filed on May 18, 2020, which are incorporated herein by reference in their entirety.

TECHNICAL FIELD

The present disclosure relates to the field of display technologies, and in particular, to a display assembly and a manufacturing method therefor, and a display device.

BACKGROUND

In a structural design of a display device (e.g., a mobile phone, a tablet computer, a wearable display product, or any other terminal product), a thickness of the display device is an important design parameter. As the display device is developing towards lightness and thinness, reducing the thickness of the display device has become a research hotspot for those skilled in the art.

SUMMARY

In a first aspect, some embodiments of the present disclosure provide a display assembly. The display assembly includes a cover plate, a film assembly, a flexible display panel and a circuit board. The flexible display panel includes a panel body and a bending portion connected to a side of the panel body. The cover plate, the film assembly and the panel body are sequentially stacked, the circuit board is disposed on a side of the panel body away from the film assembly, and the bending portion is electrically connected to the circuit board. The display assembly further includes a first bonding portion, the first bonding portion is disposed at a first side edge of the film assembly to bond at least one of the cover plate and the film assembly to the bending portion, and the first side edge of the film assembly is an edge of the film assembly proximate to the bending portion.

In some embodiments, the first bonding portion is disposed at a corner between the bending portion and the first side edge of the film assembly; or the first bonding portion is a portion of a first bonding layer, the film assembly includes another portion of the first bonding layer and at least one of a polarizer and a touch panel; the another portion of the first bonding layer is stacked with the at least one of the polarizer and the touch panel, and is bonded to the cover plate; and the first bonding portion protrudes from the first side edge of the film assembly and is bonded to the bending portion.

In some embodiments, the bending portion includes a bending segment and a connecting segment. The bending segment is in a curved shape, and in a bending direction of the bending segment, the bending segment is connected between the panel body and the connecting segment. The connecting segment is located at the side of the panel body away from the film assembly, and is electrically connected to the circuit board; the display assembly further includes a cured adhesive layer, and the cured adhesive layer covers an outer side surface of the bending segment. A first gap exists between the cured adhesive layer and the first side edge of the film assembly, and the first bonding portion is disposed in the first gap; or the first bonding portion is a portion of a first bonding layer, the film assembly includes another portion of the first bonding layer and at least one of a polarizer and a touch panel; the another portion of the first bonding layer is stack with the at least one of the polarizer and the touch panel, and is bonded to the cover plate; and the first bonding portion protrudes from the first side edge of the film assembly and is bonded to the cured adhesive layer.

In some embodiments, the display assembly further includes a second bonding portion, and the second bonding portion is disposed at an edge of the cured adhesive layer away from the panel body.

In some embodiments, the display assembly further includes an electromagnetic shielding film, the electromagnetic shielding film covers a region where elements of the circuit board are provided, and a second gap exists between the electromagnetic shielding film and the edge of the cured adhesive layer away from the panel body; and the second bonding portion is disposed in the second gap.

In some embodiments, the display assembly further includes a heat dissipation film, the heat dissipation film is disposed on the side of the panel body away from the film assembly, and the circuit board is disposed on a side of the heat dissipation film away from the panel body; and an edge of the heat dissipation film proximate to the bending segment is beyond the first side edge of the film assembly.

In some embodiments, the film assembly includes a second bonding layer, a touch panel, a polarizer and at least one portion of a first bonding layer that are sequentially stacked. The polarizer and the touch panel are integrated together, the at least one portion of the first bonding layer bonds the cover plate to the polarizer, and the second bonding layer bonds the panel body to the touch panel; or the flexible display panel is a flexible display panel integrated with a touch layer; the film assembly includes a third bonding layer, the polarizer and the at least one portion of the first bonding layer that are sequentially stacked, the at least one portion of the first bonding layer bonds the cover plate to the polarizer, and the third bonding layer bonds the panel body to the polarizer.

In a second aspect, some embodiments of the present disclosure provide a display device. The display device includes a housing and the display assembly as described in the first aspect, and the display assembly is disposed in the housing.

In a third aspect, some embodiments of the present disclosure provide a manufacturing method for the display assembly as described in the first aspect. The manufacturing method includes: providing the flexible display panel, the flexible display panel having a first surface and a second surface that are disposed opposite, and the first surface being covered with a first protective film; bonding the circuit board to an end of the bending portion of the flexible display panel away from the panel body; providing the film assembly and the cover plate on a portion of the second surface corresponding to the panel body in sequence, and providing the first bonding portion at the first side edge of the film assembly to bond the at least one of the cover plate and the film assembly to the bending portion; removing the first protective film on the first surface; and bending the bending portion after providing the first bonding portion at the first side edge of the film assembly and removing the first protective film, so that the circuit board is located on a portion of the first surface corresponding to the panel body.

In some embodiments, providing the first bonding portion at the first side edge of the film assembly to bond the at least one of the cover plate and the film assembly to the bending portion, includes: providing the first bonding portion at a corner formed by the bending portion and the first side edge of the film assembly to bond the bending portion to the first side edge of the film assembly.

In some embodiments, the bending portion includes a bending segment and a connecting segment, and the bending segment is connected between the panel body and the connecting segment. Providing the first bonding portion at the corner formed by the bending portion and the first side edge of the film assembly, includes: covering a cured adhesive layer on a portion of the second surface corresponding to the bending segment, so that a first gap is located between the cured adhesive layer and the first side edge of the film assembly; and providing the first bonding portion in the first gap.

In some embodiments, after covering the cured adhesive layer on the portion of the second surface corresponding to the bending segment and before bending the bending portion, the manufacturing method further includes: providing a second bonding portion at an edge of the cured adhesive layer away from the panel body.

In some embodiments, providing the film assembly and the cover plate on the portion of the second surface corresponding to the panel body in sequence, and providing the first bonding portion at the first side edge of the film assembly to bond the at least one of the cover plate and the film assembly to the bending portion, includes: providing at least one of a touch panel and a polarizer, and a first bonding layer on the portion of the second surface corresponding to the panel body in sequence; and attaching the cover plate to the first bonding layer, so that a portion of the first bonding layer overflows from the first side edge of the film assembly and extends to the bending portion to be bonded to the bending portion. The first bonding portion is the portion, overflowing from the first side edge, of the first bonding layer; the film assembly includes the at least one of the polarizer and the touch panel, and another portion of the first bonding layer.

In some embodiments, the bending portion includes a bending segment and a connecting segment, and the bending segment is connected between the panel body and the connecting segment. Attaching the cover plate to the first bonding layer, so that the portion of the first bonding layer overflows from the first side edge of the film assembly and extends to the bending portion to be bonded to the bending portion, includes: covering a cured adhesive layer on a portion of the second surface corresponding to the bending segment; and attaching the cover plate to the first bonding layer, so that the portion of the first bonding layer overflows from the first side edge of the film assembly and extends to the cured adhesive layer to be bonded to the cured adhesive layer.

In some embodiments, after covering the cured adhesive layer on the portion of the second surface corresponding to the bending segment and before bending the bending portion, the manufacturing method further includes: providing a second bonding portion at an edge of the cured adhesive layer away from the panel body.

In some embodiments, providing the second bonding portion at the edge of the cured adhesive layer away from the panel body, includes: covering an electromagnetic shielding film on a region where elements of the circuit board are provided, so that a second gap is located between the electromagnetic shielding film and the edge of the cured adhesive layer away from the panel body; and providing the second bonding portion in the second gap.

In some embodiments, after removing the first protective film on the first surface and before bending the bending portion, the manufacturing method further includes: covering a heat dissipation film on the portion of the first surface corresponding to the panel body, so that an edge of the heat dissipation film proximate to a bending segment is beyond the first side edge of the film assembly.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meanings, i.e., "including, but not limited to". In the description of the specification, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. The term "coupled" or "communicatively coupled", however, may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein means an open and inclusive expression, which does not exclude devices that are applicable to or configured to perform additional tasks or steps.

In addition, the phase "based on" used is meant to be open and inclusive, since a process, step, calculation or other action that is "based on" one or more of the stated conditions or values may, in practice, be based on additional conditions or value exceeding those stated.

As used herein, terms such as "about" or "approximately" include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Figure 1:
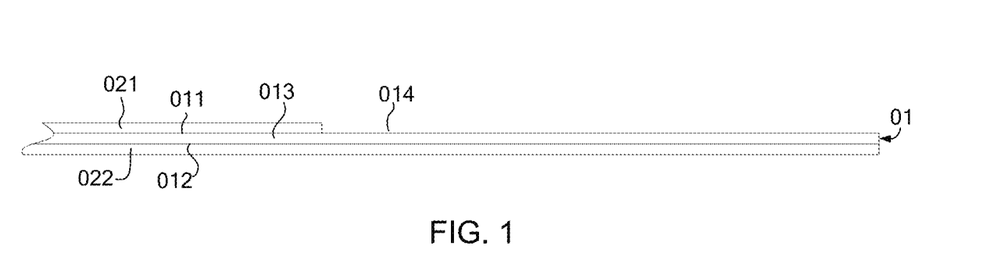
FIG. 1 is a schematic diagram showing a structure of a flexible display panel in the related art.

As shown in FIG. 1, the figure is a schematic diagram showing a structure of a flexible display panel 01 in the related art. The flexible display panel 01 has a first surface 011 and a second surface 012 that are arranged opposite, the first surface 011 is covered with a first protective film 021, and the second surface 012 is covered with a second protective film 022.

Figure 2:
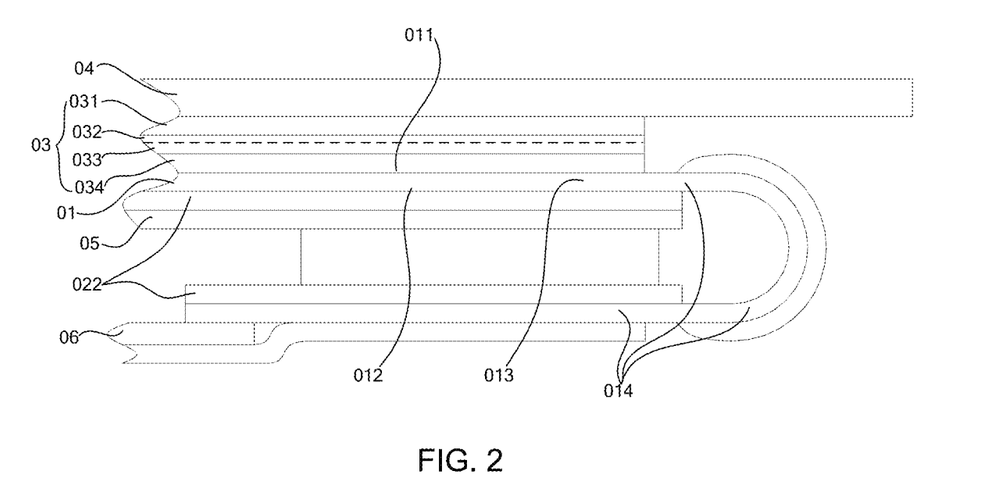
FIG. 2 is a schematic diagram showing a structure of a display assembly in the related art.

As shown in FIG. 2, the figure is a schematic diagram showing a structure of a display assembly in the related art. The display assembly includes the flexible display panel 01, a film assembly 03 and a cover plate 04 that are sequentially stacked on the first surface 011 of a panel body 013, and a heat dissipation film 05 and a circuit board 06 that are sequentially located on a side of the second protective film 022 away from the panel body 013. The flexible display panel 01 includes the panel body 013 and a bending portion 014 connected to a side of the panel body 013. The film assembly 03 includes a first bonding layer 031, a polarizer 032, a touch panel 033 and a second bonding layer 034 that are sequentially stacked; the bending portion 014 of the flexible display panel 01 is electrically connected to the circuit board 06.

In a process of assembling the display assembly, the first protective film 021 is removed before the film assembly 03 is assembled on the flexible display panel 01, and a portion of the second protective film 022 on a bending segment of the bending portion 014 is removed before the bending portion 014 is bent to ensure smooth bending of the bending portion 014.

In the display assembly, as shown in FIG. 2, the bending portion 014 of the flexible display panel 01 needs to be bent to be electrically connected to the circuit board 06 at a side of the panel body 013. In a bending process, a portion of the bending portion 014 located at an edge of the film assembly 03 is apt to be separated from the film assembly 03 due to a pulling force of the bending. In order to prevent the portion of the bending portion 014 located at the edge of the film assembly 03 from being separated from the film assembly 03, as shown in FIG. 2, an edge of a portion of the second protective film 022 on the panel body 013 is beyond the edge of the film assembly 03, so that the second protective film 022 can support the portion of the bending portion 014 located at the edge of the film assembly 03 to prevent the bending portion 014 from being separated from the edge of the film assembly 03 in the bending process.

In the above display assembly, by providing the second protective film 022 to support the flexible display panel 01, it is possible to prevent the bending portion 014 from being separated from the edge of the film assembly 03 in the bending process. However, a thickness of the display assembly will increase due to the second protective film 022, which is disadvantageous to lightness and thinness of the display assembly.

As shown in FIGS. 5 to 8, some embodiments of the present disclosure provide a display assembly. The display assembly includes a cover plate 1, a film assembly 2, a flexible display panel 3 including a panel body 31 and a bending portion 32 connected to a side of the panel body 31, and a circuit board 4. The cover plate 1, the film assembly 2 and the panel body 31 are sequentially stacked. The circuit board 4 is disposed on a side of the panel body 31 away from the film assembly 2, and the bending portion 32 is electrically connected to the circuit board 4.

The film assembly 2 may include a polarizer 21 and/or a touch panel 22, which may be determined according to actual situations. The flexible display panel 3 may be an organic light-emitting diode (OLED) display panel.

As shown in FIGS. 5 to 8, the display assembly further includes a first bonding portion 51 disposed at a first side edge 23 of the film assembly 2, so that the film assembly 2 may be bonded to the bending portion 32. The first side edge 23 of the film assembly 2 is an edge of the film assembly 2 proximate to the bending portion 32.

In addition to bonding the film assembly 2 to the bending portion 32, the first bonding portion 51 may also bond the cover plate 1 to the bending portion 32. Alternatively, the first bonding portion 51 may bond the cover plate 1 to the bending portion 32.

In the display assembly of the embodiments of the present disclosure, as shown in FIGS. 5 to 8, the first bonding portion 51 is disposed at the first side edge 23 of the film assembly 2, so that at least one of the cover plate 1 and the film assembly 2 is bonded to the bending portion 32. Therefore, a connection between the bending portion 32 and the first side edge 23 of the film assembly 2 may be reinforced. In this way, when the bending portion 32 is bent, a bonding force of the first bonding portion 51 may resist the pulling force generated by the bending portion 32, thereby preventing a portion of the bending portion 32 located at the first side edge 23 of the film assembly 2 from being separated from the film assembly 2 in a bending process. As a result, there is no need for the display assembly to provide protective film(s) on a surface of the panel body 31 away from the film assembly 2 to support the portion of the bending portion 32 located at the first side edge 23 of the film assembly 2, so that an increase in a thickness of the at least one protective film may be avoided while the portion of the bending portion 32 located at the first side edge 23 is prevented from being separated from the film assembly 2 in the bending process, thereby facilitating the lightness and thinness of the display assembly.

In the display assembly provided in the embodiments of the present disclosure, an arrangement position of the first bonding portion 51 at the first side edge 23 of the film assembly 2 is not unique, and the first bonding portion 51 includes at least the following arrangement positions.

Figure 5:
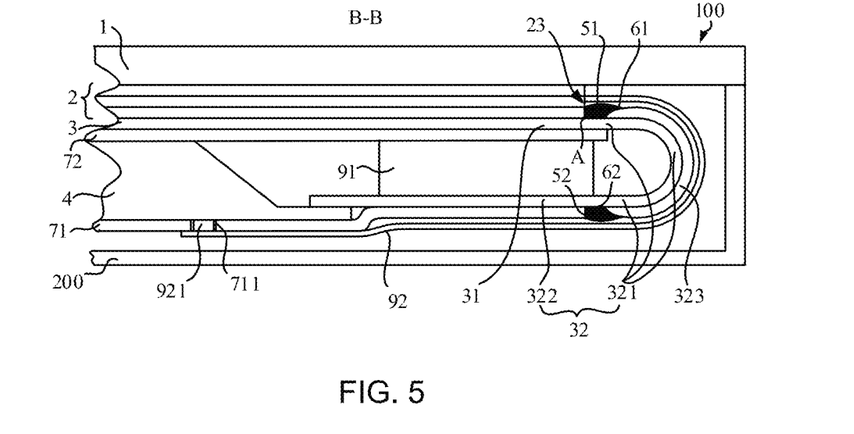
FIG. 5 is a sectional view of the display device in FIG. 3 taken along the line B-B.
Figure 6:
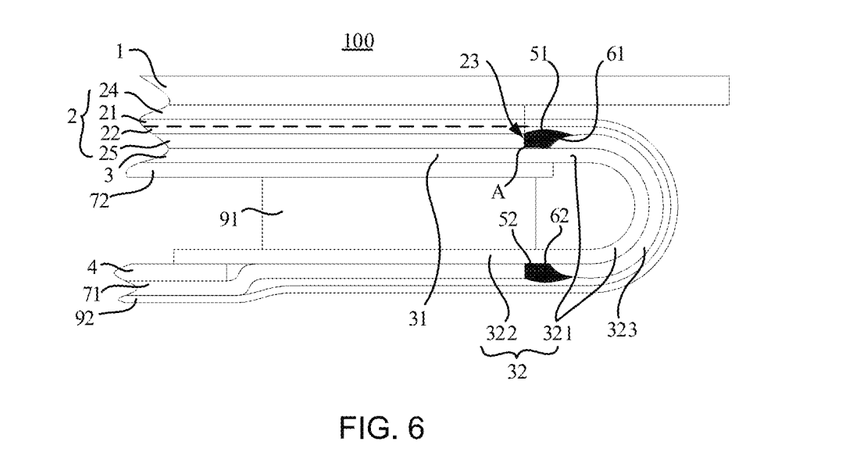
FIG. 6 is a schematic diagram showing a structure of a display assembly, in accordance with some embodiments of the present disclosure.
Figure 8:
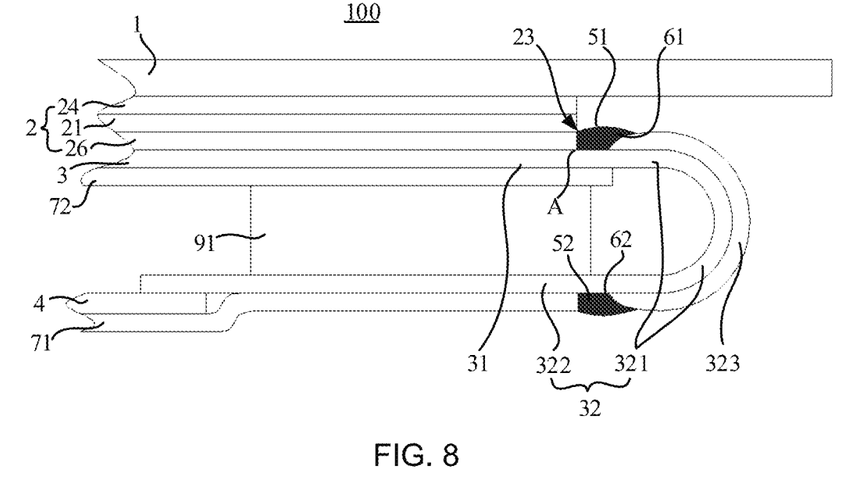
FIG. 8 is a schematic diagram showing a structure of a display assembly, in accordance with yet some other embodiments of the present disclosure.

FIGS. 5, 6 and 8 show a first arrangement position of the first bonding portion 51 in embodiments. In the embodiments, the first bonding portion 51 is disposed at a corner A formed by the bending portion 32 and the first side edge 23 of the film assembly 2. In the bending process of the bending portion 32, a separation between the bending portion 32 and the film assembly 2 starts from the corner A formed by the bending portion 32 and the first side edge 23 of the film assembly 2. That is, the corner A formed by the bending portion 32 and the first side edge 23 of the film assembly 2 is a starting position of the separation. By arranging the first bonding portion 51 at the corner A formed by the bending portion 32 and the first side edge 23 of the film assembly 2, it is possible to enhance strength of a connection between the bending portion 32 and the film assembly 2 at the corner A, thereby better preventing the portion of the bending portion 32 located at the first side edge 23 from being separated from the film assembly 2 in the bending process.

The first bonding portion 51 may be an adhesive gel (as shown in FIG. 6), but is not limited thereto. The bonding portion 51 may also be any other component capable of achieving adhesion.

Figure 7:
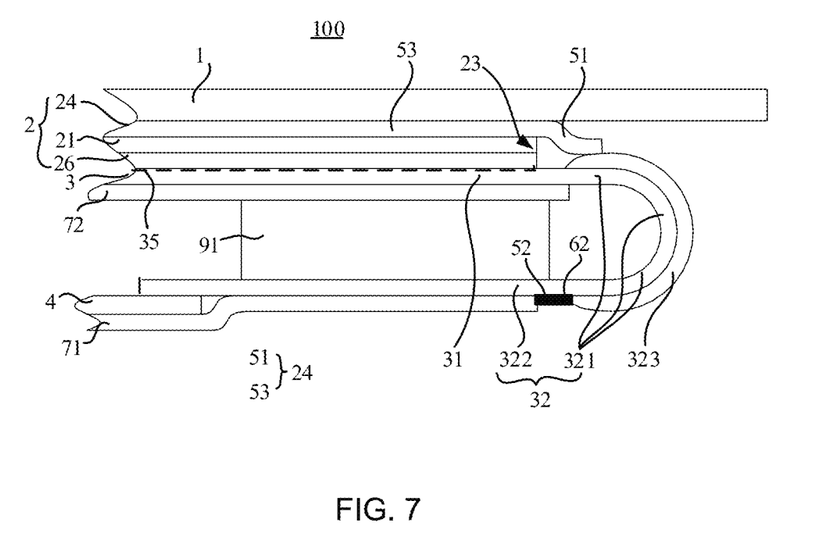
FIG. 7 is a schematic diagram showing a structure of a display assembly, in accordance with some other embodiments of the present disclosure.

FIG. 7 shows a second arrangement position of the first bonding portion 51 in embodiments. In the embodiments, the first bonding portion 51 is a portion of a first bonding layer 24, and the film assembly 2 further includes another portion 53 of the first bonding layer 24. The another portion 53 of the first bonding layer 24 is arranged stacked with at least one of the polarizer 21 and the touch panel 22, and is bonded to the cover plate 1. The first bonding portion 51 protrudes from the first side edge 23 of the film assembly 2 and is bonded to the bending portion 32. In the embodiments, the first bonding portion 51 is formed by the overflowing of the first bonding layer 24 when the cover plate 1 is attached to the first bonding layer 24. In this way, a process of providing the first bonding portion 51 and a process of attaching the cover plate 1 to the first bonding layer 24 may be completed simultaneously, and a separate process for providing the first bonding portion 51 is not required, thereby simplifying a process of manufacturing the display assembly.

The first bonding layer 24 may be an optically clear adhesive (OCA) layer, but is not limited thereto. The first bonding layer 24 may also be any other adhesive layer capable of achieving adhesion.

In the display assembly provided in some embodiments of the present disclosure, as shown in FIGS. 5 to 8, the bending portion 32 of the flexible display panel 3 includes a bending segment 321 and a connecting segment 322; the bending segment 321 is in a curved shape, and in a bending direction of the bending segment 321, the bending segment 321 is connected between the panel body 31 and the connecting segment 322. The connecting segment 322 is located at the side of the panel body 31 away from the to film assembly 2, and is electrically connected to the circuit board 4.

In some embodiments, in order to control a shape of the bending segment 321 after being bent, as shown in FIGS. 5 to 8, the display assembly further includes a cured adhesive layer 323, and the cured adhesive layer 323 covers an outer surface of the bending segment 321. By arranging the cured adhesive layer 323 on the outer surface of the bending segment 321, the bending segment 321 may be shaped and hardened after the cured adhesive layer 323 is cured, which prevents the bending segment 321 from being greatly deformed when the bending segment 321 is subjected to an external force, thereby ensuring consistency of the shape of the bending segment 321 after being bent in mass production.

The cured adhesive layer 323 may be an ultraviolet (UV) cured adhesive layer 323, but is not limited thereto. The cured adhesive layer 323 may also be a bonding layer formed by any other cured adhesive.

For the first arrangement position of the first bonding portion 51, in some embodiments, as shown in FIGS. 5, 6 and 8, a first gap 61 is formed between the cured adhesive layer 323 and the first side edge 23 of the film assembly 2, and the first bonding portion 51 is disposed in the first gap 61. In this way, the first gap 61 may serve to position the first bonding portion 51, and the first bonding portion 51 may be accurately disposed at the corner A formed by the bending portion 32 and the first side edge 23 of the film assembly 2 to facilitate the arrangement of the first bonding portion 51. Moreover, by arranging the first bonding portion 51 in the first gap 61, the first bonding portion 51 may be in contact with the bending segment 321, the cured adhesive layer 323 and the first side edge 23 of the film assembly 2, so that a contact area of the first bonding portion 51 may be increased. As a result, the bending portion 32 may be more firmly bonded to the first side edge 23 of the film assembly 2, which is better for preventing the bending portion 32 from being separated from the film assembly 2 in the bending process.

For the second arrangement position of the first bonding portion 51, in some embodiments, as shown in FIG. 7, the first bonding portion 51 protrudes from the first side edge 23 of the film assembly 2 and is bonded to the cured adhesive layer 323. In the case where the first bonding portion 51 is bonded to the cured adhesive layer 323, since the cured adhesive layer 323 has a certain thickness, a top of the cured adhesive layer 323 is closer to a top of the first side edge 23. In this way, it is easier for the first bonding portion 51 to extend onto the cured adhesive layer 323 when the first bonding portion 51 is formed by the overflowing, thereby ensuring that the first bonding portion 51 is sufficiently in contact with the cured adhesive layer 323, and further ensuring that the first bonding portion 51 is more firmly bonded to the bending portion 32.

In the display assembly provided in some embodiments of the present disclosure, as shown in FIGS. 5 to 8, the display assembly further includes a second bonding portion 52, and the second bonding portion 52 is disposed at an edge of the cured adhesive layer 323 away from the panel body 31. Through the cooperation between the second bonding portion 52 and the first bonding portion 51, i.e., through the definition of a starting point of bending of the bending segment 321 by the first bonding portion 51 and the definition of an ending point of the bending of the bending segment 321 by the second bonding portion 52, the shape of the bending segment 321 after being bent may be better controlled, thereby better ensuring the consistency of the shape of the bending segment 321 after being bent in the mass production.

The second bonding portion 52 may be an adhesive gel (as shown in FIG. 6), but is not limited thereto. The second bonding portion 52 may also be any other component capable of achieving adhesion.

In some embodiments, as shown in FIGS. 5 to 8, the display assembly further includes an electromagnetic shielding film 71. The electromagnetic shielding film 71 covers a region where elements of the circuit board 4 are provided. Since the electromagnetic shielding film 71 covers the region where the elements of the circuit board 4 are provided, the electromagnetic shielding film 71 serves to shield electromagnetic interference. As a result, mutual electromagnetic interference between the elements of the circuit board 4 and other electronic element(s) is avoided, thereby ensuring the normal operation of the elements of the circuit board 4.

The electromagnetic shielding film 71 may be an integrated circuit (IC) cover tape.

As shown in FIGS. 5 to 8, a second gap 62 is formed between the electromagnetic shielding film 71 and the edge of the cured adhesive layer 323 away from the panel body 31, and the second bonding portion 52 is disposed in the second gap 62. In this way, the second gap 62 may serve to position the second bonding portion 52, and the second bonding portion 52 may be accurately disposed at the edge of the cured adhesive layer 323 away from the panel body 31. Moreover, by arranging the second bonding portion 52 in the second gap 62, the second bonding portion 52 may be in contact with the electromagnetic shielding film 71, the cured adhesive layer 323 and the flexible display panel 3, so that a contact area of the second bonding portion 52 may be increased. As a result, it may enhance the fastness of the bonding of the second bonding portion 52, so as to prevent the second bonding portion 52 from falling off.

In some embodiments, as shown in FIG. 5, the display assembly further includes a heat dissipation film 72; the heat dissipation film 72 is stacked on the side of the panel body 31 away from the film assembly 2, and the circuit board 4 is stacked on a side of the heat dissipation film 72 away from the panel body 31. By arranging the heat dissipation film 72, heat dissipation of the flexible display panel 3 may be better, and a temperature of the flexible display panel 3 may be prevented from being too high in a working process. Moreover, by arranging the heat dissipation film 72, the panel body 31 of the flexible display panel 3 may also be protected, which prevents other component(s) from being directly in contact with the panel body 31 to damage the panel body 31.

As shown in FIGS. 5 to 8, an edge of the heat dissipation film 72 proximate to the bending segment 321 may be beyond the first side edge 23 of the film assembly 2. In addition, the edge of the heat dissipation film 72 proximate to the bending segment 321 may also be flush with the first side edge 23 of the film assembly 2. As shown in FIGS. 5 to 8, in the case where the edge of the heat dissipation film 72 proximate to the bending segment 321 is beyond the first side edge 23 of the film assembly 2, when the bending portion 32 is bent, the edge of the heat dissipation film 72 proximate to the bending segment 321 may support the portion of the bending portion 32 located at the first side edge 23 of the film assembly 2, thereby better preventing the bending portion 32 from being separated from the first side edge 23 of the film assembly 2 in the bending process.

In some embodiments, as shown in FIGS. 5 to 8, the display assembly further includes a fourth bonding layer 91, and the fourth bonding layer 91 is disposed between the heat dissipation film 72 and the connecting segment 322 and bonds the heat dissipation film 72 to the connecting segment 322. Therefore, the bending portion 32 may be fixed to prevent the bending portion 32 from shaking due to an action of the external force.

The fourth bonding layer 91 may be a bonding layer, or may be an adhesive tape, such as a polyethylene terephthalate (PET) adhesive tape, which is not specifically limited here.

In some embodiments, as shown in FIG. 6, the film assembly 2 includes a second bonding layer 25, the touch panel 22, the polarizer 21 and at least one portion of the first bonding layer 24 that are sequentially stacked. The polarizer 21 is integrated with the touch panel 22 (polarizer and touch Sensor Integration). The at least one portion of the first bonding layer 24 bonds the cover plate 1 to the polarizer 21, and the second bonding layer 25 bonds the panel body 31 to the touch panel 22. By integrating the polarizer 21 and the touch panel 22 together, there is no need to bond the polarizer 21 to the touch panel 22 by providing a bonding layer therebetween, which may not only facilitate assembling of the film assembly 2, but also reduce a thickness of the film assembly 2, thereby reducing the thickness of the display assembly.

In the embodiments, as shown in FIGS. 5 and 6, an assembly formed by integrating the polarizer 21 with the touch panel 22 is electrically connected to the circuit board 4 through a flexible circuit board 92. For example, as shown in FIG. 5, the electromagnetic shielding film 71 is provided with avoidance opening(s) 711 therein, and connection terminal(s) 921 of the flexible circuit board 92 is electrically connected to the circuit board 4 passing through the avoidance opening(s) 711.

In some other embodiments, as shown in FIGS. 7 and 8, the flexible display panel 3 is a flexible display panel 3 integrated with a touch layer 35. The film assembly 2 includes a third bonding layer 26, the polarizer 21 and at least one portion of the first bonding layer 24 that are sequentially stacked. The at least one portion of the first bonding layer 24 bonds the cover plate 1 to the polarizer 21, and the third bonding layer 26 bonds the panel body 31 to the polarizer 21. By integrating the touch layer 35 into the flexible display panel 3, there is no need to attach the touch panel 22, and there is no need to electrically connect the touch panel 22 to the circuit board 4 through the flexible circuit board 92, thereby simplifying a process of assembling the display assembly.

The second bonding layer 25 and the third bonding layer 26 may both be OCA layers, but are not limited thereto, and they may also be other bonding layers capable of achieving adhesion.

Some embodiments of the present disclosure provide a display device, and the display device may be a mobile phone, a notebook computer, a tablet computer, a television, etc., which is not specifically limited here. A structure of the display device is described below by taking the mobile phone as an example.

Figure 3:
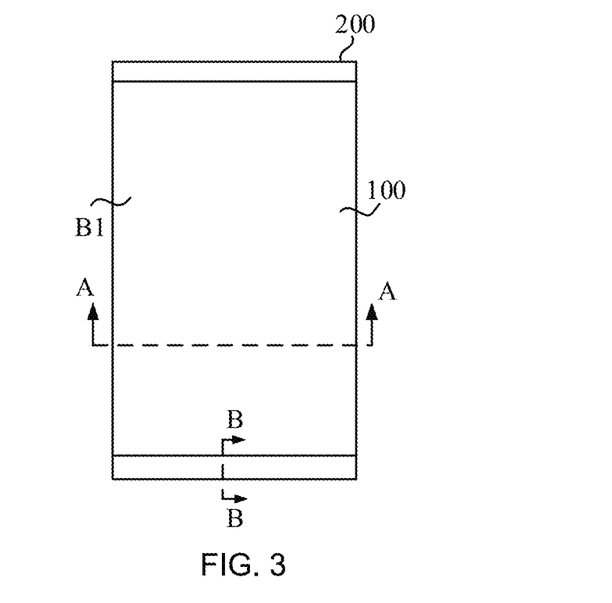
FIG. 3 is a schematic diagram showing a structure of a display device, in accordance with some embodiments of the present disclosure.

As shown in FIG. 3, the figure shows a front view of the display device (the mobile phone), and the reference sign B1 denotes a display area of the display device.

Figure 4:
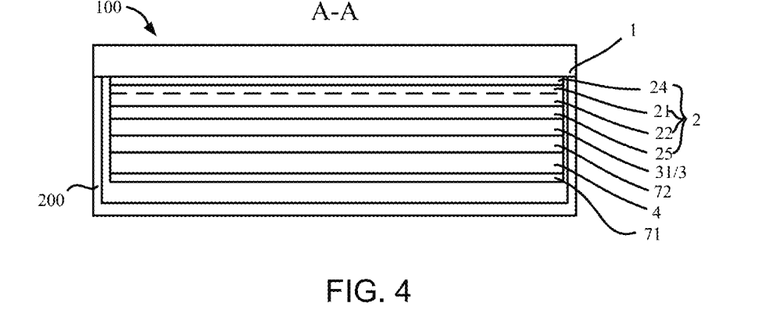
FIG. 4 is a sectional view of the display device in FIG. 3 taken along the line A-A.

As shown in FIGS. 4 and 5, FIG. 4 is a sectional view of the display device in FIG. 3 taken along the line A-A, and FIG. 5 is a sectional view of the display device in FIG. 3 taken along the line B-B. The display device includes a housing 200 and the display assembly 100 as described in any of the above embodiments, and the display assembly 100 is disposed in the housing 200. The cover plate 1 of the display assembly 100 is disposed at an opening of the housing 200.

Beneficial effects that may be achieved by the display device provided in the above embodiments of the present disclosure are the same as the beneficial effects that may be achieved by the above display assembly, which will not be described in detail here.

Figure 12:
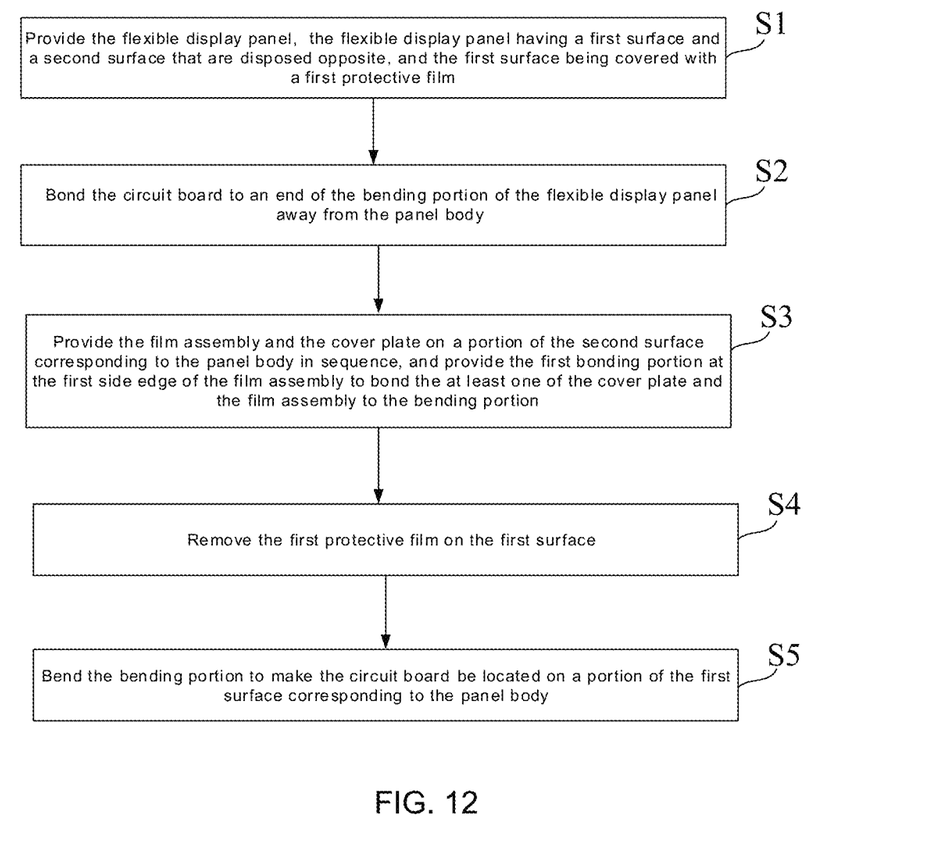
FIG. 12 is a flow diagram of a manufacturing method for a display assembly, in accordance with some embodiments of the present disclosure.

As shown in FIG. 12, embodiments of the present disclosure provide a manufacturing method for the display assembly as described in any of the above embodiments, and the manufacturing method includes the following steps.

Figure 9:
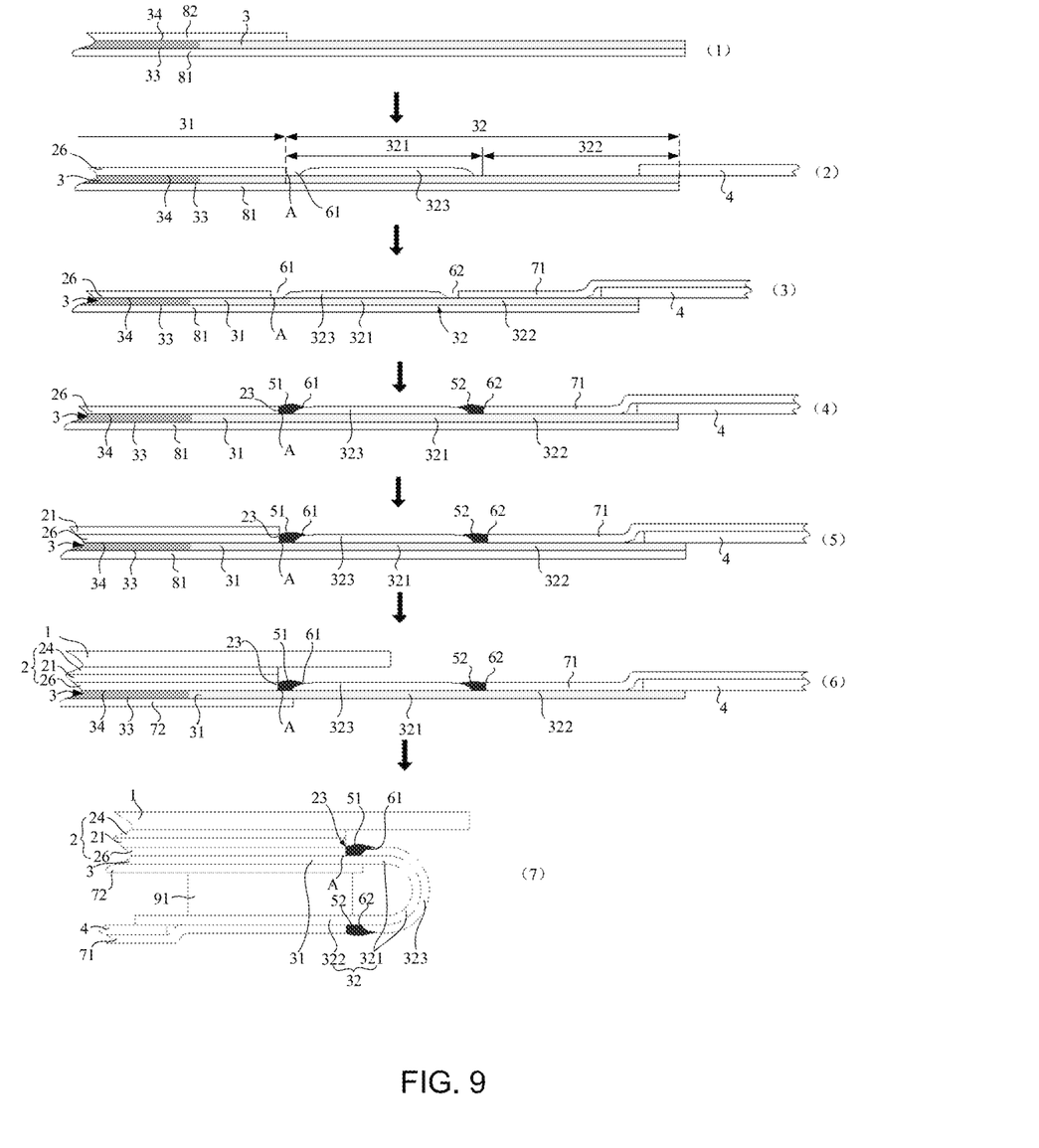
FIG. 9 is a schematic diagram showing a process of manufacturing the display assembly shown in FIG. 8.

In S1, as shown in (1) in FIG. 9, the flexible display panel 3 is provided.

The flexible display panel 3 has a first surface 33 and a second surface 34 that are opposite to each other, and the first surface 33 is covered with a first protective film 81. The first protective film 81 may support the flexible display panel 3, so as to facilitate subsequent arrangement of other components on the flexible display panel 3. In (1) in FIG. 9, a dark area of the flexible display panel 3 is the display area, and a light area of the flexible display panel 3 is a peripheral area outside the display area.

In S2, as shown in (2) in FIG. 9, the circuit board 4 is bonded to an end of the bending portion 32 of the flexible display panel 3 away from the panel body 31.

Connection terminals of the circuit board 4 may be connected to connection terminals on the end of the bending portion 32 away from the panel body 31 through a conductive adhesive, so as to achieve bonding of the circuit board 4.

In S3, as shown in (3) to (6) in FIG. 9, the film assembly 2 and the cover plate 1 are sequentially provided on a portion of the second surface 34 corresponding to the panel body 31; as shown in (4) to (6) in FIG. 9, the first bonding portion 51 is provided at the first side edge 23 of the film assembly 2 to bond the film assembly 2 to the bending portion 32.

As shown in (6) in FIG. 9, in addition to bonding the film assembly 2 to the bending portion 32, the first bonding portion 51 may also bond the cover plate 1 to the bending portion 32. Alternatively, the first bonding portion 51 may bond the cover plate 1 to the bending portion 32.

In S4, as shown in (6) in FIG. 9, the first protective film 81 on the first surface 33 is removed.

The first protective film 81 may be removed by using laser irradiation, or by using a chemical manner, e.g., by using dissolving solution.

In S5, as shown in (7) in FIG. 9, the bending portion 32 is bent to make the circuit board 4 be located on the first surface 33 of the panel body 31.

The circuit board 4 may be directly attached to a portion of the first surface 33 corresponding to the panel body 31. Alternatively, the circuit board 4 may be indirectly attached to the portion of the first surface 33 corresponding to the panel body 31. For example, there are other film layer(s) between the circuit board 4 and the panel body 31.

The S2 may also be provided between the S3 and the S4, which is not specifically limited here. As shown in (1) in FIG. 9, the first surface 33 of the flexible display panel 3 is covered with the first protective film 81, and besides, the second surface 34 of the flexible display panel 3 may be provided with a second protective film 82. The second protective film 82 may cover the panel body 31, or may cover both the panel body 31 and the bending portion 32, which is not specifically limited here. As shown in (2) in FIG. 9, the second protective film 82 may be removed before S3 to ensure manufacturing of the film assembly 2. The first protective film 81 and the second protective film 82 may both be PET protective films.

In the manufacturing method for the display assembly in the embodiments of the present disclosure, by providing the first bonding portion 51 at the first side edge 23 of the film assembly 2 to bond the at least one of the cover plate 1 and the film assembly 2 to the bending portion 32, the connection between the bending portion 32 and the first side edge 23 of the film assembly 2 may be reinforced. In this way, when the bending portion 32 is bent subsequently, the bonding force of the first bonding portion 51 may resist the pulling force generated by the bending portion 32, thereby preventing a portion of the bending portion 32 located at the first side edge 23 of the film assembly 2 from being separated from the film assembly 2 in the bending process. In the manufacturing method for the display assembly, by removing the first protective film 81 before bending the bending portion 32, after the display assembly is manufactured, the thickness of display assembly may be reduced while the portion of the bending portion 32 located at the first side edge 23 is prevented from being separated from the film assembly 2 in the bending process, thereby facilitating the lightness and thinness of the display assembly.

In the S3, an arrangement manner of the first bonding portion 51 at the first side edge 23 of the film assembly 2 is not unique, and the first bonding portion 51 includes at least the following arrangement manners.

FIG. 9 shows a first arrangement manner of the first bonding portion 51. In the first arrangement manner, providing the first bonding portion 51 at the first side edge 23 of the film assembly 2 to bond the film assembly 2 to the bending portion 32 in the S3, includes: as shown in (4) to (6) in FIG. 9, providing the first bonding portion 51 at the corner A formed by the bending portion 32 and the first side edge 23 of the film assembly 2, so as to bond the bending portion 32 to the first side edge 23 of the film assembly 2.

The first bonding portion 51 may be filled in the corner A in a length direction of the corner A, or a plurality of dot-shaped first bonding portions 51 may be provided at intervals in the length direction of the corner A, which may be determined according to actual situations.

The first bonding portion 51 may be provided after the film assembly 2 is manufactured and before the cover plate 1 is attached, or may be provided in a process of manufacturing the film assembly 2. For example, as shown in (4) in FIG. 9, the first bonding portion 51 may be provided at the corner A formed by an edge of the third bonding layer 26 proximate to the bending portion 32 and the bending portion 32 after the third bonding layer 26 of the film assembly 2 is manufactured, thereby greatly increasing flexibility of the arrangement of the first bonding portion 51.

In the first arrangement manner of the first bonding portion 51, in order to facilitate the arrangement of the first bonding portion 51 and improve the fastness of the bonding of the first bonding portion 51, providing the first bonding portion 51 at the corner A formed by the bending portion 32 and the first side edge 23 of the film assembly 2, includes: as shown in (2) in FIG. 9, covering the cured adhesive layer 323 on a portion of the second surface 34 corresponding to the bending segment 321, so that the first gap 61 is located between the cured adhesive layer 323 and the first side edge 23 of the film assembly 2 (or between the edge of the third bonding layer 26 proximate to the bending portion 32 and the bending portion 32); and as shown in (4) to (6) in FIG. 9, providing the first bonding portion 51 in the first gap 61.

The bending portion 32 includes the bending segment 321 and the connecting segment 322, and the bending segment 321 is connected between the panel body 31 and the connecting segment 322. The first bonding portion 51 may be provided in the first gap 61 before the cured adhesive layer 323 is completely cured, so as to prevent the cured adhesive layer 323 from affecting the bending of the bending segment 321.

By providing the first bonding portion 51 in the first gap 61, the first gap 61 may serve to position the first bonding portion 51, and the first bonding portion 51 may be accurately disposed at the corner A formed by the bending portion 32 and the first side edge 23 of the film assembly 2 to facilitate the arrangement of the first bonding portion 51; and meanwhile, a contact area between the first bonding portion 51 and the bending portion 32 may be increased. As a result, the bending portion 32 may be more firmly bonded to the first side edge 23 of the film assembly 2, which is better for preventing the bending portion 32 from being separated from the film assembly 2 in the bending process.

Figure 10:
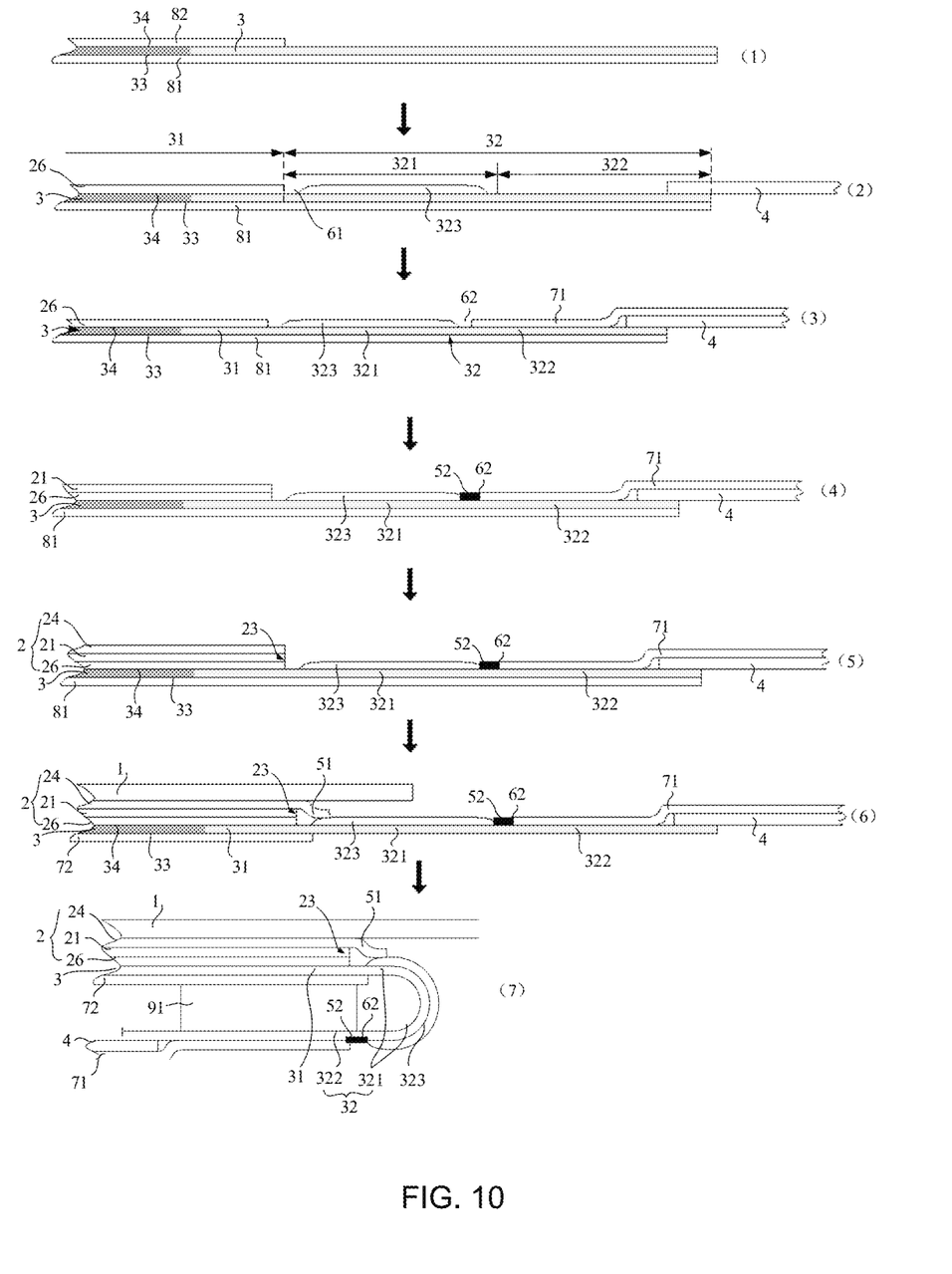
FIG. 10 is a schematic diagram showing a process of manufacturing the display assembly shown in FIG. 7.

FIG. 10 shows a second arrangement manner of the first bonding portion 51. In the second arrangement manner, the S3 includes the following steps.

In S31, as shown in (2) to (5) in FIG. 10, at least one of the touch panel 22 and the polarizer 21, and the first bonding layer 24 are sequentially provided on the portion of the second surface 34 corresponding to the panel body 31.

In S32, as shown in (6) in FIG. 10, the cover plate 1 is attached to the first bonding layer 24, so that a portion of the first bonding layer 24 overflows from the first side edge 23 of the film assembly 2 and extends to the bending portion 32 to be bonded to the bending portion 32.

The film assembly 2 includes at least one of the polarizer 21 and the touch panel 22, and another portion of the first bonding layer 24. The first bonding portion 51 is the portion, overflowing from the first side edge 23, of the first bonding layer 24. By controlling a thickness of the first bonding layer 24 and a pressure of attaching the cover plate 1, a size of the first bonding portion 51 formed by the overflowing of the first bonding layer 24 during the cover plate 1 is attached to the first bonding layer 24 may be controlled, so that a size of the contact area between the first bonding portion 51 and the bending portion 32 may be controlled, thereby controlling a magnitude of the bonding force between the first bonding portion 51 and the bending portion 32.

In the second arrangement manner of the first bonding portion 51, the first bonding portion 51 is formed in a process of attaching the cover plate 1 to the first bonding layer 24. That is, a process of providing the first bonding portion 51 and the process of attaching the cover plate 1 to the first bonding layer 24 are completed simultaneously. In this way, a separate process for providing the first bonding portion 51 is not required, thereby simplifying the process of manufacturing the display assembly.

In some embodiments, the S32 includes the following steps.

In S321, as shown in (2) in FIG. 10, the cured adhesive layer 323 is covered on the portion of the second surface 34 corresponding to the bending segment 321.

In S322, as shown in (6) in FIG. 10, the cover plate 1 is attached to the first bonding layer 24, so that the portion of the first bonding layer 24 overflows from the first side edge 23 of the film assembly 2 and extends to the cured adhesive layer 323 to be bonded to the cured adhesive layer 323.

The bending portion 32 includes the bending segment 321 and the connecting segment 322, and the bending segment 321 is connected between the panel body 31 and the connecting segment 322. The S322 may be provided before the cured adhesive layer 323 is completely cured, so as to prevent the cured adhesive layer 323 from affecting the bending of the bending segment 321.

By providing the above steps, it is easier for the first bonding portion 51 to extend onto the cured adhesive layer 323 when the first bonding portion 51 is formed by the overflowing, thereby ensuring that the first bonding portion 51 is sufficiently in contact with the cured adhesive layer 323, and further ensuring that the first bonding portion 51 is more firmly bonded to the bending portion 32.

In some embodiments, after the cured adhesive layer 323 is covered on the portion of the second surface 34 corresponding to the bending segment 321 and before the bending portion 32 is bent, the manufacturing method further includes: as shown in (4) in FIG. 10, providing the second bonding portion 52 at an edge of the cured adhesive layer 323 away from the panel body 31. By providing the second bonding portion 52, the ending point of the bending of the bending segment 321 may be defined by the second bonding portion 52. The first bonding portion 51 may define the starting point of the bending of the bending segment 321. As a result, the shape of the bending segment 321 after being bent may be better controlled, thereby ensuring the consistency of the shape of the bending segment 321 after being bent in the mass production.

In some embodiments, providing the second bonding portion 52 at the edge of the cured adhesive layer 323 away from the panel body 31, includes: as shown in (3) in FIG. 10, covering the electromagnetic shielding film 71 on the region where the elements of the circuit board 4 are provided, so that the second gap 62 is located between the electromagnetic shielding film 71 and the edge of the cured adhesive layer 323 away from the panel body 31; and as shown in (4) in FIG. 10, providing the second bonding portion 52 in the second gap 62. The second bonding portion 52 may be filled in the second gap 62 in a length direction of the second gap 62, or a plurality of dot-shaped the second bonding portions 52 may be provided at intervals in the second gap 62, which is not specifically limited here.

By providing the second bonding portion 52 in the second gap 62, the second gap 62 may serve to position the second bonding portion 52, which facilitates the accurate arrangement of the second bonding portion 52 at the edge of the cured adhesive layer 323 away from the panel body 31. Moreover, a contact area between the second bonding portion 52 and the bending portion 32 may be increased, thereby improving the fastness of the bonding of the second bonding portion 52.

In some embodiments, after the first protective film 81 on the first surface 33 is removed and before the bending portion 32 is bent, the manufacturing method further includes: as shown in (6) in FIG. 10, covering the heat dissipation film 72 on the portion of the first surface 33 corresponding to the panel body 31, so that the edge of the heat dissipation film 72 proximate to the bending segment 321 is beyond the first side edge 23 of the film assembly 2. By providing the heat dissipation film 72 in this way, when the bending portion 32 is bent, the edge of the heat dissipation film 72 proximate to the bending segment 321 may support the portion of the bending portion 32 located at the first side edge 23 of the film assembly 2, thereby better preventing the portion of the bending portion 32 located at the first side edge 23 from being separated from the film assembly 2 in the bending process.

In some embodiments, after the heat dissipation film 72 is covered on the portion of the first surface 33 corresponding to the panel body 31 and before the bending portion 32 is bent, the manufacturing method further includes: as shown in (7) in FIG. 10, providing the fourth bonding layer 91 on a surface of the heat dissipation film 72 away from the panel body 31. In this case, bending the bending portion 32 to make the circuit board 4 be located on the portion of the first surface 33 corresponding to the panel body 31, includes: bending the bending portion 32 to make the circuit board 4 be located on the portion of the first surface 33 corresponding to the panel body 31, and bonding the connecting segment 322 to the fourth bonding layer 91. Through the above steps, after the bending portion 32 is bent, the connecting segment 322 may be bonded to the fourth bonding layer 91 to fix the connecting segment 322. In this way, the bending portion 32 may be fixed, so that the bending portion 32 may be prevented from shaking due to the action of the external force.

In the S3, according to different structures of the film assembly 2, a manner for providing the film assembly 2 on the portion of the second surface 34 corresponding to the panel body 31 is various. In some embodiments, providing the film assembly 2 on the portion of the second surface 34 corresponding to the panel body 31, includes: as shown in (2) to (6) in FIG. 11, sequentially providing the second bonding layer 25, the touch panel 22, the polarizer 21 and the first bonding layer 24 on the portion of the second surface 34 corresponding to the panel body 31 to form the film assembly 2. The touch panel 22 and the polarizer 21 may be integrated together (as shown in (5) in FIG. 11), or may be designed separately, which is not specifically limited here. The manufacturing method is applicable to the manufacturing of film assembly 2 in a case where the touch panel 22 and the flexible display panel 3 are designed separately.

Figure 11:
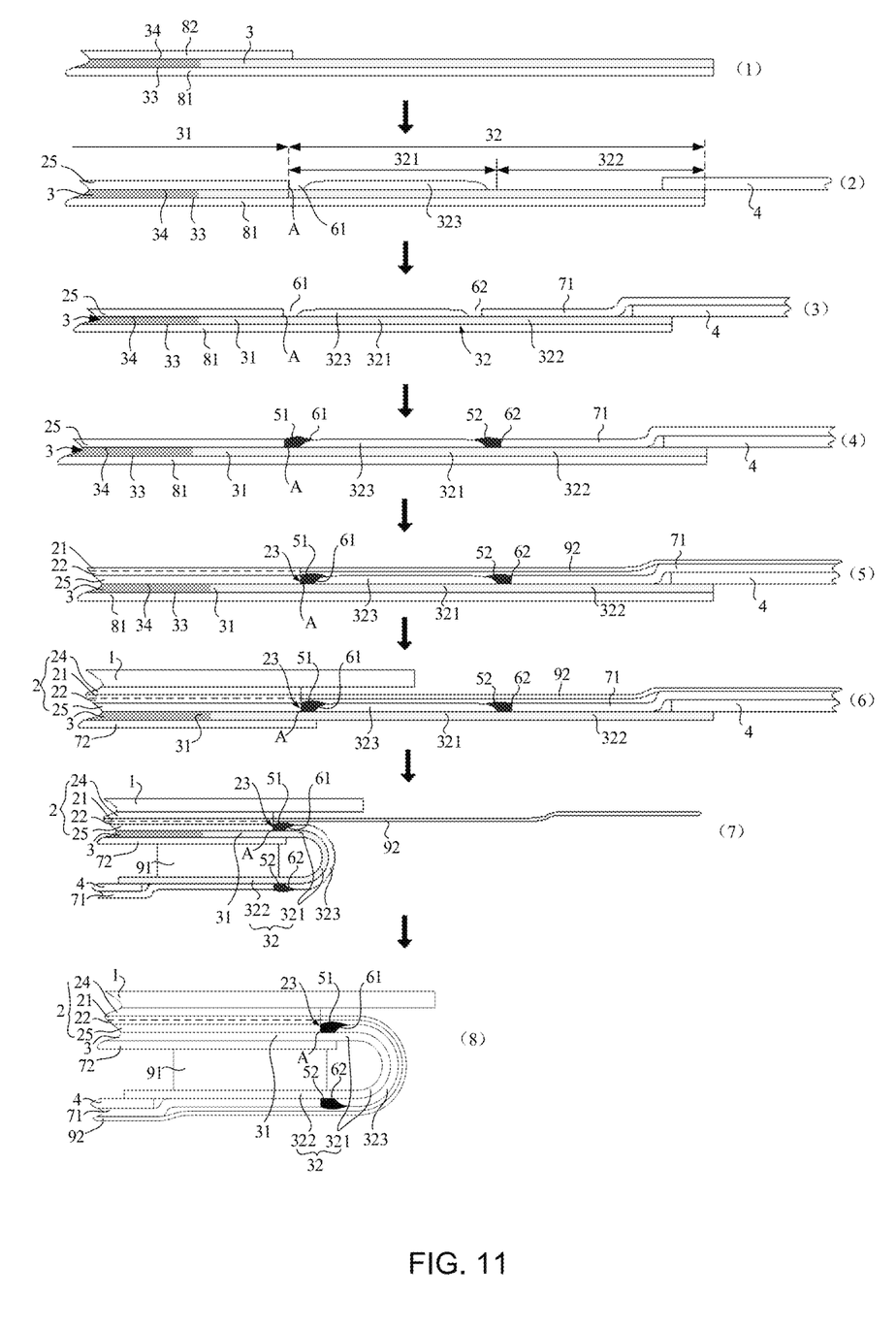
FIG. 11 is a schematic diagram showing a process of manufacturing the display assembly shown in FIG. 6.

In the embodiments, after the bending portion 32 is bent to make the circuit board 4 be located on the portion of the first surface 33 corresponding to the panel body 31, the manufacturing method further includes: as shown in (7) and (8) of FIG. 11, bending the flexible circuit board 92 to be electrically connected to the circuit board 4.

In some other embodiments, providing the film assembly 2 on the portion of the second surface 34 corresponding to the panel body 31, includes: as shown in (2) to (6) in FIGS. 9 and 10, sequentially providing the third bonding layer 26, the polarizer 21 and the at least one portion of the first bonding layer 24 on the second surface 34 of the panel body 31 to form the film assembly 2. The manufacturing method is applicable to the manufacturing of the film assembly 2 in a case where the touch layer 35 and the flexible display panel 3 are integrated together.

For features described in the embodiments of the manufacturing method for the display assembly that are the same as or similar to those of product embodiments of the display assembly, reference may be made to the description in the product embodiments of the display assembly, and the features will not be described in detail here.

In the description in the above embodiments, specific features, structures, materials or characteristics may be combined in any suitable manner in any one or more embodiments or examples.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display assembly, comprising:
   a cover plate;
   a film assembly;
   a flexible display panel including a panel body and a bending portion connected to a side of the panel body; and
   a circuit board; wherein
   the cover plate, the film assembly and the panel body are sequentially stacked, the circuit board is disposed on a side of the panel body away from the film assembly, and the bending portion is electrically connected to the circuit board, wherein the bending portion includes a bending segment and a connecting segment; the bending segment is in a curved shape, and in a bending direction of the bending segment, the bending segment is connected between the panel body and the connecting segment; the connecting segment is located at the side of the panel body away from the film assembly, and is electrically connected to the circuit board; and
   the display assembly further comprises a first bonding portion and a cured adhesive layer; the first bonding portion is disposed at a first side edge of the film assembly to bond at least one of the cover plate and the film assembly to the bending portion, and the first side edge of the film assembly is an edge of the film assembly proximate to the bending portion; and the cured adhesive layer covers an outer side surface of the bending segment;

wherein a first gap exists between the cured adhesive layer and the first side edge of the film assembly, and the first bonding portion is disposed in the first gap; or the first bonding portion is a portion of a first bonding layer, the film assembly includes another portion of the first bonding layer and at least one of a polarizer and a touch panel; the another portion of the first bonding layer is stacked with the at least one of the polarizer and the touch panel, and is bonded to the cover plate; and the first bonding portion protrudes from the first side edge of the film assembly and is bonded to the cured adhesive layer.

2. The display assembly according to claim 1, wherein in a case where the first bonding portion is disposed in the first gap, the first bonding portion is disposed at a corner between the bending portion and the first side edge of the film assembly.

3. The display assembly according to claim 1, further comprises a second bonding portion disposed at an edge of the cured adhesive layer away from the panel body.

4. The display assembly according to claim 3, further comprises an electromagnetic shielding film, the electromagnetic shielding film covers a region where elements of the circuit board are provided, and a second gap exists between the electromagnetic shielding film and the edge of the cured adhesive layer away from the panel body; and
the second bonding portion is disposed in the second gap.

5. The display assembly according to claim 1, further comprises a heat dissipation film, the heat dissipation film is disposed on the side of the panel body away from the film assembly, and the circuit board is disposed on a side of the heat dissipation film away from the panel body; and
an edge of the heat dissipation film proximate to the bending segment is beyond the first side edge of the film assembly.

6. The display assembly according to claim 1, wherein the film assembly includes a second bonding layer, the touch panel, the polarizer and at least one portion of the first bonding layer that are sequentially stacked; the polarizer and the touch panel are integrated together, the at least one portion of the first bonding layer bonds the cover plate to the polarizer, and the second bonding layer bonds the panel body to the touch panel.

7. A display device, comprising a housing and the display assembly according to claim 1, the display assembly being disposed in the housing.

8. A manufacturing method for the display assembly according to claim 1, the manufacturing method comprising:
providing the flexible display panel, wherein the flexible display panel has a first surface and a second surface that are disposed opposite, and the first surface is covered with a first protective film;
bonding the circuit board to an end of the bending portion of the flexible display panel away from the panel body;
providing the film assembly and the cover plate on a portion of the second surface corresponding to the panel body in sequence, and providing the first bonding portion at the first side edge of the film assembly to bond the at least one of the cover plate and the film assembly to the bending portion;
removing the first protective film on the first surface; and
bending the bending portion after providing the first bonding portion at the first side edge of the film assembly and removing the first protective film, so that the circuit board covers a portion of a first surface of the panel body;

wherein in a case where the first bonding portion is disposed in the first gap, providing the first bonding portion at the first side edge of the film assembly to bond the at least one of the cover plate and the film assembly to the bending portion, includes:
providing the first bonding portion at a corner formed between the bending portion and the first side edge of the film assembly to bond the bending portion to the first side edge of the film assembly;
wherein providing the first bonding portion at the corner formed between the bending portion and the first side edge of the film assembly, includes:
covering the cured adhesive layer on a portion of the second surface corresponding to the bending segment, so that the first gap is located between the cured adhesive layer and the first side edge of the film assembly; and
providing the first bonding portion in the first gap.

9. A manufacturing method for the display assembly according to claim 1, the manufacturing method comprising:
providing the flexible display panel, wherein the flexible display panel has a first surface and a second surface that are disposed opposite, and the first surface is covered with a first protective film;
bonding the circuit board to an end of the bending portion of the flexible display panel away from the panel body;
providing the film assembly and the cover plate on a portion of the second surface corresponding to the panel body in sequence, and providing the first bonding portion at the first side edge of the film assembly to bond the at least one of the cover plate and the film assembly to the bending portion;
removing the first protective film on the first surface; and
bending the bending portion after providing the first bonding portion at the first side edge of the film assembly and removing the first protective film, so that the circuit board covers a portion of a first surface of the panel body;
wherein in a case where the first bonding portion is the portion of the first bonding layer providing the film assembly and the cover plate on the portion of the second surface corresponding to the panel body in sequence, and providing the first bonding portion at the first side edge of the film assembly to bond the at least one of the cover plate and the film assembly to the bending portion, includes:
providing at least one of the touch panel and the polarizer, and the first bonding layer on the portion of the second surface corresponding to the panel body in sequence; and
attaching the cover plate to the first bonding layer, so that the portion of the first bonding layer overflows from the first side edge of the film assembly and extends to the bending portion to be bonded to the bending portion, wherein the first bonding portion is the portion, overflowing from the first side edge, of the first bonding layer; the film assembly includes the at least one of the polarizer and the touch panel, and the another portion of the first bonding layer;
wherein attaching the cover plate to the first bonding layer, so that the portion of the first bonding layer overflows from the first side edge of the film assembly and extends to the bending portion to be bonded to the bending portion, includes:

covering the cured adhesive layer on a portion of the second surface corresponding to the bending segment; and attaching the cover plate to the first bonding layer, so that the portion of the first bonding layer overflows from the first side edge of the film assembly and extends to the cured adhesive layer to be bonded to the cured adhesive layer.

10. The method according to claim 8, wherein
after covering the cured adhesive layer on the portion of the second surface corresponding to the bending segment and before bending the bending portion, the manufacturing method further comprises:
providing a second bonding portion at an edge of the cured adhesive layer away from the panel body.

11. The method according to claim 10, wherein
providing the second bonding portion at the edge of the cured adhesive layer away from the panel body, includes:
covering an electromagnetic shielding film on a region where elements of the circuit board are provided, so that a second gap is located between the electromagnetic shielding film and the edge of the cured adhesive layer away from the panel body; and
providing the second bonding portion in the second gap.

12. The method according to claim 8, wherein
after removing the first protective film on the first surface and before bending the bending portion, the manufacturing method further comprises:
covering a heat dissipation film on the portion of the first surface corresponding to the panel body, so that an edge of the heat dissipation film proximate to the bending segment is beyond the first side edge of the film assembly.

13. A display assembly, comprising:
a cover plate;
a film assembly;
a flexible display panel including a panel body and a bending portion connected to a side of the panel body; and
a circuit board; wherein
the cover plate, the film assembly and the panel body are sequentially stacked, the circuit board is disposed on a side of the panel body away from the film assembly, and the bending portion is electrically connected to the circuit board;
the display assembly further comprises a first bonding portion, the first bonding portion is disposed at a first side edge of the film assembly to bond at least one of the cover plate and the film assembly to the bending portion, and the first side edge of the film assembly is an edge of the film assembly proximate to the bending portion; and
the first bonding portion is a portion of a first bonding layer, the film assembly includes another portion of the first bonding layer and at least one of a polarizer and a touch panel; the another portion of the first bonding layer is stacked with the at least one of the polarizer and the touch panel, and is bonded to the cover plate; and
the first bonding portion protrudes from the first side edge of the film assembly and is bonded to the bending portion.

14. The display assembly according to claim 1, wherein
the flexible display panel is a flexible display panel integrated with a touch layer, the film assembly includes a third bonding layer, the polarizer and at least one portion of the first bonding layer that are sequentially stacked, the at least one portion of the first bonding layer bonds the cover plate to the polarizer, and the third bonding layer bonds the panel body to the polarizer.

15. The method according to claim 9, wherein
after covering the cured adhesive layer on the portion of the second surface corresponding to the bending segment and before bending the bending portion, the manufacturing method further comprises:
providing a second bonding portion at an edge of the cured adhesive layer away from the panel body.

16. A display assembly, comprising:
a cover plate;
a film assembly;
a flexible display panel including a panel body and a bending portion connected to a side of the panel body; and
a circuit board; wherein
the cover plate, the film assembly and the panel body are sequentially stacked, the circuit board is disposed on a side of the panel body away from the film assembly, and the bending portion is electrically connected to the circuit board; and
the display assembly further comprises a first bonding portion, the first bonding portion is disposed at a first side edge of the film assembly to bond at least one of the cover plate and the film assembly to the bending portion, and the first side edge of the film assembly is an edge of the film assembly proximate to the bending portion;
wherein the film assembly includes a second bonding layer, a touch panel, a polarizer and at least one portion of a first bonding layer that are sequentially stacked; the polarizer and the touch panel are integrated together, the at least one portion of the first bonding layer bonds the cover plate to the polarizer, and the second bonding layer bonds the panel body to the touch panel; or
the flexible display panel is a flexible display panel integrated with a touch layer; the film assembly includes a third bonding layer, a polarizer and at least one portion of a first bonding layer that are sequentially stacked, the at least one portion of the first bonding layer bonds the cover plate to the polarizer, and the third bonding layer bonds the panel body to the polarizer.

17. The method according to claim 9, wherein
after removing the first protective film on the first surface and before bending the bending portion, the manufacturing method further comprises:
covering a heat dissipation film on the portion of the first surface corresponding to the panel body, so that an edge of the heat dissipation film proximate to the bending segment is beyond the first side edge of the film assembly.

* * * * *